(12) United States Patent
Delpech et al.

(10) Patent No.: US 6,391,802 B1
(45) Date of Patent: May 21, 2002

(54) METHOD OF MANUFACTURING AN INTEGRATED CAPACITOR ONTO A SILICON SUBSTRATE

(75) Inventors: Philippe Delpech, Meylan; Jean-Claude Oberlin, Le Touvet, both of (FR)

(73) Assignee: STMicroelectronics, S.A., Crolles (FR)

( * ) Notice: Subject to any disclaimer, the term of this patent is extended or adjusted under 35 U.S.C. 154(b) by 0 days.

(21) Appl. No.: 09/644,027

(22) Filed: Aug. 22, 2000

(30) Foreign Application Priority Data

Aug. 31, 1999 (FR) .............................. 99 11139

(51) Int. Cl.[7] .............................................. H01L 21/31
(52) U.S. Cl. ...................................................... 438/785
(58) Field of Search ................................. 438/785, 788, 438/792, 243, 250, 253, 386, 396, 786, 787

(56) References Cited

U.S. PATENT DOCUMENTS

| | | | |
|---|---|---|---|
| 5,366,910 A | 11/1994 | Ha et al. | 437/40 |
| 5,468,687 A | 11/1995 | Carl et al. | 437/235 |
| 5,479,316 A * | 12/1995 | Smrtic et al. | 361/322 |
| 5,948,216 A * | 9/1999 | Cava et al. | 204/192.22 |
| 6,204,203 B1 * | 3/2001 | Narwankar et al. | 438/785 |
| 6,325,017 B1 * | 12/2001 | DeBoer et al. | 118/723 R |

FOREIGN PATENT DOCUMENTS

| | | | |
|---|---|---|---|
| EP | 0 860 868 A2 | 8/1998 | |
| EP | 860868 A2 * | 8/1998 | H01L/21/3105 |

OTHER PUBLICATIONS

Aoyama et al., J. Electrochem. Soc., vol. 143, No. 3, Mar. 1996, pp. 977–983.*

* cited by examiner

Primary Examiner—David Nelms
Assistant Examiner—Quoc Hoang

(57) ABSTRACT

Method of manufacturing a capacitor integrated onto a silicon substrate, comprising a step of depositing a layer of first electrode, a step of depositing a layer of a dielectric material, a step of exposure of the dielectric layer to a plasma and a step of depositing a layer of second electrode. This creates the advantage of a design of capacitors with metallic electrodes having a good linearity versus voltage.

9 Claims, 1 Drawing Sheet

METHOD OF MANUFACTURING AN INTEGRATED CAPACITOR ONTO A SILICON SUBSTRATE

BACKGROUND OF THE INVENTION

1. Technical Field

The present invention relates to the field of integrated circuits and in particular to integrated capacitors onto a silicon substrate. The present invention relates more particularly to a method of manufacturing an integrated capacitor onto a silicon substrate, comprising a step of depositing a first electrode layer, a step of depositing a dielectric material layer, and a step of depositing a second electrode layer.

2. Description of the Related Art

Nowadays, it is usual practice to design integrated circuits with one or more high value integrated capacitors, which advantageously replace discrete conventional capacitors. Such capacitors have various applications in the field of analog or RF (radiofrequency) circuits, for example for filtering supply voltages, in the design of resonant antenna circuits, etc.

Among the known integrated capacitors, capacitors with metallic electrodes have many advantages compared to capacitors with polysilicon electrodes.

On one hand, metallic electrodes have an excellent electric conductivity, when polysilicon electrodes need, to that effect, a silicide formation process in the presence of a metal like tungsten or titanium.

Capacitors with metallic electrodes are furthermore very easy to manufacture, the lower electrode being generally made from one of the last metallic layers of integrated circuits, for example the metallic layer used to make the upper level conductive tracks or the contact pads. Thus, compared to the conventional method of manufacturing integrated circuits, the design of a capacitor with metallic electrodes only needs a step of depositing, at a low temperature (less than 500° C.), a layer of a dielectric material on a pre-existing metallic layer, used as a first electrode layer, and a step of depositing a second electrode metallic layer. The layers of first and second electrodes are then etched to obtain the desired capacity.

Lastly, capacitors with metallic electrodes have a small parasitic capacity regard to the silicon substrate, because they are made, as just described, on one of the last levels of integrated circuits.

However, in practice, capacitors with metallic electrodes present a poor linearity versus voltage. The linearity versus voltage, or "voltage linearity", is conventionally defined by the ratio $\Delta C/C$, where C is the value of the capacity at a voltage equal to zero and $\Delta C$ the fluctuations of the capacity C according to the applied voltage. The ratio $\Delta C/C$ of a capacitor with metallic electrodes is typically in the order of $200 \cdot 10^{-6}/V$, i. e. a linearity defect at least 10 times above the value which is generally tolerated by designers of analog integrated circuits.

For this reason, capacitors with metallic electrodes, in spite of the above recalled advantages, have at present few applications only in the field of analog circuits, in particular in the field of RF circuits. The present invention is directed to avoid this drawback.

SUMMARY OF THE INVENTION

Thus, an object of the present invention is to improve the voltage linearity of capacitors formed by a non thermally treated dielectric layer sandwiched between two conductive layers, in particular capacitors with metallic electrodes.

The foregoing objects are achieved as is now described.

After various studies, the authors of the present invention have emitted the hypothesis that the above-mentioned non-linearity phenomenon, which appears a little only in capacitors with polysilicon electrodes, is linked to the fact that capacitors with metallic electrodes, unlike capacitors with polysilicon electrodes, are not subject to an annealing step at a high temperature, conventionally performed with a temperature in the order of 850° C. during several tens of minutes. It is indeed recalled that, in the conventional manufacturing process of integrated circuits, the conventional annealing steps for dopant activation are always performed before depositing the metallic layers, in order not to deteriorate them.

More particularly, the present invention is based on the hypothesis that the poor voltage linearity of capacitors with metallic electrodes is linked to the presence of impurities in the dielectric and/or to an incomplete formation of the dielectric (existence of pendant linkages), which are likely to disappear with a high temperature annealing.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

With reference now to the figures, and in particular with reference to FIG. 1, manufacturing an integrated capacitor onto a silicon substrate is achieved by a manufacturing method of the above described type comprising, before the step of depositing the second electrode layer, an exposure step of the dielectric layer to a plasma, performed under vacuum in conditions of duration, energy and density of the plasma chosen so that the dielectric layer is not damaged.

Advantageously, the plasma comprises an ultraviolet radiation with an intensity chosen among the high values of the ultraviolet intensity range provided by the plasma generator which is used.

According to one embodiment, the plasma is an argon/oxygen plasma.

According to one embodiment, the plasma is an oxygen plasma.

According to one embodiment, the plasma is a nitrogen monoxide plasma.

According to one embodiment, the layers of first and second electrode are metallic layers.

According to one embodiment, the dielectric layer is deposited under a gaseous phase at a temperature lower than 500° C.

According to one embodiment, the dielectric layer is mainly made of silicon dioxide.

According to one embodiment, the dielectric layer is mainly made of a material chosen in the group comprising silicon nitride, silicon oxinitride, tantalum pentoxide.

According to one embodiment, the metallic layer of upper and/or lower electrode is made of a material chosen in the group comprising aluminum, copper, tungsten, titanium, titanium nitride and their alloys.

These objects, characteristics and advantages of the present invention will be described with more details in the following description of the method of the invention, in conjunction with FIGS. 1A to 1E which show various manufacturing steps of a capacitor with metallic electrodes according to the invention.

Figure 1A:
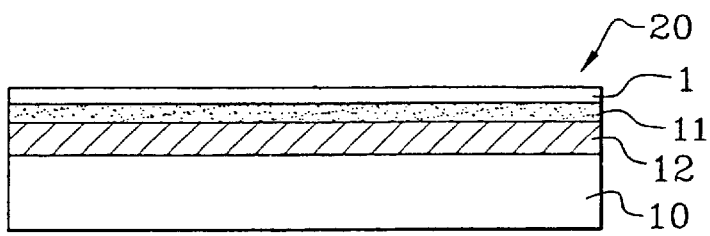
FIG. 1 depicts a partial cross sectional view of an integrated circuit during its manufacture, in a zone of the integrated circuit where a capacitor 20 with metallic electrodes must be designed in accordance with a preferred embodiment of the present invention.
FIG. 1B depicts depositing a layer of a dielectric material 2, made for example of silicon dioxide $SiO_2$ on the layer of first electrode 1 in accordance with a preferred embodiment of the present invention.
FIG. 1C depicts processing of the dielectric layer 2 is then performed by means of a plasma 5, preferably a plasma of oxygen/argon $O_2/Ar$ in accordance with a preferred embodiment of the present invention.
FIG. 1D depicts depositing, on the dielectric layer 2, a metallic layer of second electrode 3, whose composition may be identical to the one of the layer of first electrode 1. in accordance with a preferred embodiment of the present invention.
FIG. 1E depicts etching the layers 1, 3 of first and second electrode, starting with the layer of second electrode 3, to provide a capacitor structure 20 having electrodes 21, 23 with desired sizes.

FIG. 1A is a partial cross sectional view of an integrated circuit during its manufacture, in a zone of the integrated circuit where a capacitor 20 with metallic electrodes must be designed. At this manufacturing stage, capacitor 20 comprises only a first electrode 1 metallic layer deposited onto a silicon substrate 10 above an electrically insulating layer 11. As mentioned in the preamble, this layer of first electrode 1 is preferably one of the last metal layers of the integrated circuit, for example the layer "Metal 4", "Metal 5", "Metal 6" . . . , depending on the structure of the integrated circuit and the number of conductive levels that it comprises. Thus, between the layer of first electrode 1 and the substrate 10 itself, there may be other layers of the integrated circuit, in particular metallic layers separated by insulating layers, schematically represented by a hatched region 12. The metallic layer of first electrode 1, for example made of aluminum (Al), is conventionally deposited under vacuum by means of a metal vapor.

Figure 1B:
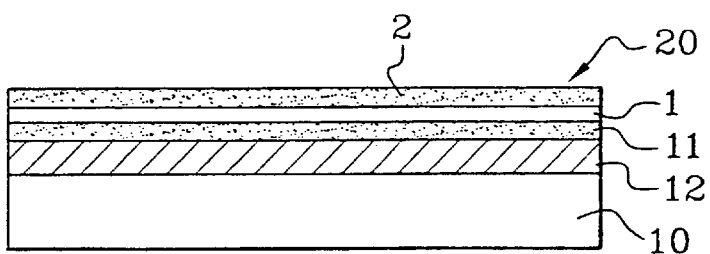

As illustrated in FIG. 1B, a layer of a dielectric material 2, made for example of silicon dioxide $SiO_2$, is then deposited on the layer of first electrode 1. The dielectric layer 2 is deposited in gaseous phase according to the conventional CVD technique ("Chemical Vapor Deposition"), in the presence of oxygen and a silicon composition like silane $SiH_4$, and in the presence of a plasma helping the oxide formation. The depositing is performed with a low temperature, i.e. a temperature less than 500° C., preferably in the order of 400 to 450° C., in order not to damage the lower metallic layers and also to avoid the formation of "hillocks" at the surface of the dielectric layer. As mentioned in the preamble, no further high temperature annealing step of the dielectric material 2 is provided.

Figure 1C:
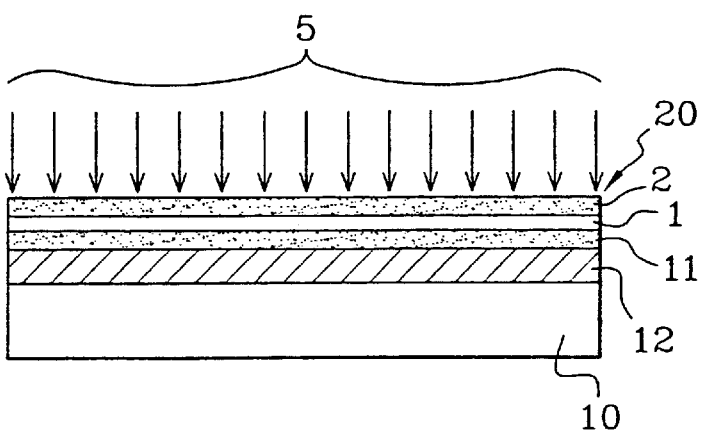

As illustrated in FIG. 1C, according to the invention, a processing of the dielectric layer 2 is then performed by means of a plasma 5, preferably a plasma of oxygen/argon $O_2/Ar$. This processing is performed under vacuum, for example in the presence of a primary vacuum maintained by pumping, in conditions of duration, energy and electron density of the plasma chosen so that the dielectric layer is not damaged. In practice, these conditions are chosen so that the plasma processing step according to the invention only causes a negligible etching of the dielectric layer 2.

The plasma furthermore generates an ultraviolet radiation having a positive effect on the results provided by the method of the invention, said effect being added to the effect provided by the plasma itself. Preferably, the intensity of the UV radiation is set to a high value in the range of UV intensities provided by the plasma generator. In practice, the intensity and the energy of the UV radiation are determined by the experimental conditions of the frame, by the power of the plasma, by the nature, the rate and the pressure of the gas, and by the temperature and the density of the plasma.

By way of a non limiting example, the experiments made by the applicant, in order to confirm the advantages of the method of the invention, have been performed in the following conditions:

plasma frame commercialized by the firm "Applied Materials" under the reference "Ultima", reactor of the UCP type, total power delivered by the two RF generators in the order of 4 KW, $O_2$ and Ar gas rate in the order of 100 cc/min and pressure in the order of a few milliTorr, electron temperature comprised between 4 and 7 eV and electron density of the plasma in the order of $10^{11}$ to $10^{12}$ electrons/cm$^3$.

The processing duration, the intensity of the UV radiation and the bandwidth of the UV radiation must be adapted to the nature and the thickness of the dielectric layer to be processed, as well as to the nature and the density of the extrinsic dipoles of the dielectric layer whose linkages must be broken (see explanations here-after). The processing duration is for example in the order of one to two minutes in the above described conditions and depends also on the intensity of the obtained UV radiation.

Figure 1D:
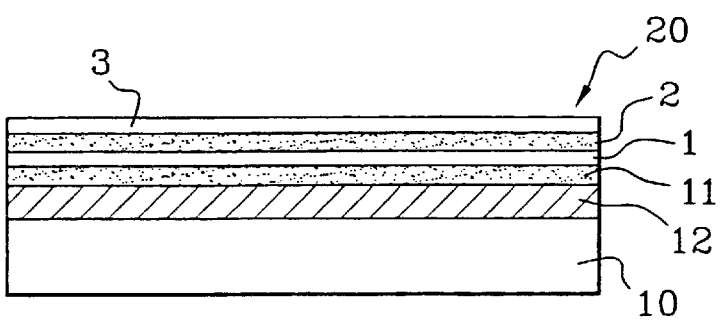

As illustrated in FIG. 1D, there is then conventionally deposited, on the dielectric layer 2, a metallic layer of second electrode 3, whose composition may be identical to the one of the layer of first electrode 1. The layer of first electrode 1 has conventionally a thickness in the order of 500 nanometers, the dielectric layer 2 has a thickness in the order of some tens of nanometers, and the layer of second electrode 3 has a thickness in the order 150 nanometers.

Figure 1E:
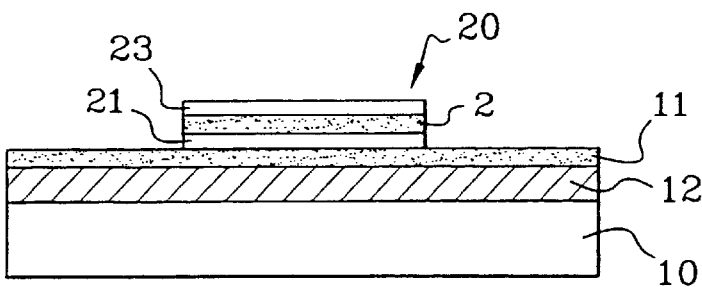

As illustrated in FIG. 1E, the layers 1, 3 of first and second electrode are then etched, starting with the layer of second electrode 3, to provide a capacitor structure 20 having electrodes 21, 23 with desired sizes. Generally, the surface of the electrodes 21, 23 may vary in large proportions, according to the desired value of the capacitor, between a square micrometer and a square millimeter.

The above mentioned evaluation experiments of the present invention have shown that the plasma processing according to the invention has a beneficial effect on the linearity of the capacitors with metallic electrodes, which has been brought back to acceptable values in the order of 20 $10^{-6}$/V with several tested dielectrics, that is a reduction by a factor 10 of the non-linearity observed with conventional capacitors. Furthermore, these experiments have shown the advantage of an intensification of the ultraviolet radiation.

The hypothesis made by the inventors for explaining these satisfactory results will now be described, in a non limiting way and with usual reservations.

As mentioned in the preamble, the inventors consider that the bad voltage linearity of conventional capacitors with metallic electrodes is linked to:

1) the unintentional incorporation, when depositing the dielectric layer 2, of impurities such as atoms of hydrogen H, nitrogen N or carbon C, creating for example, in the case of a silicon oxide, electric dipoles SiOH, SiH, NH, SiC distributed in a random and non homogeneous way, orientating under the effect of the electric field (when a voltage is applied), which varies the electric permittivity ∈ of the dielectric layer according to voltage.

2) the existence of pendant linkages on silicon atoms (in the case of silicon oxide depositing) or on tantalum atoms (in the case of tantalum oxide depositing), generating an ability to electric polarization of dielectric layer 2. For example, $SiO_2$ oxide deposited at a low temperature has a composition of the type $SiO_x$, with x<2.

Thus, the plasma processing according to the invention, carried on after depositing the dielectric layer 2 has the following positive effects:

1) the ionized oxygen of the plasma penetrates into the dielectric layer and saturates the pendant linkages while making denser the dielectric, creating for example $SiO_2$ molecules in the case of a silicon oxide, 2) the photon energy brought by the ultraviolet rays penetrates still deeper into the dielectric layer 2 and breaks for example the linkages SiH, SiOH, NH, releasing the hydrogen, nitrogen and carbon impurities present in the dielectric layer, 3) the heating effect produced by the plasma (up to 400° C.) contributes also to the breaking of the SiH, SiOH, NH linkages.

In practice, the greatest contribution to the phenomenon of non-linearity seems to come from the high hydrogen ratio contained in the dielectric layer. The processing applied in the context of the above mentioned experiments causes a decrease of this ratio, initially in the order of 4 to 5%, to below 1%.

For example, a SiH molecule comprising an hydrogen linkage and a pendant linkage, of the type:

becomes, after the release of the hydrogen atom and the saturation of the pendant linkages, a silicon oxide molecule:

Similarly, a SiOH molecule of the type:

becomes, after processing according to the invention, a silicon oxide molecule.

In practice, the method of the invention is likely to have various alternative embodiments regarding the processing duration, the energy and the density of the plasma, and the nature of the ionized gas forming the plasma, which may also be oxygen $O_2$ or nitrogen monoxide $N_2O$.

The method of the invention is applicable to various known dielectrics, in particular silicon dioxide $SiO_2$, silicon nitride SiN, silicon oxinitride SiON, tantalum pentoxide $Ta_2O_5$, etc.

The layers of first and second electrode may be made of various known metals or alloys, in particular aluminium (Al), the aluminium-copper (Al—Cu), copper (Cu), tungsten (W), titanium (Ti), titanium nitride (TiN), etc.

Lastly, the present invention is likely to be applied to other known integrated capacitors. There is found in the foregoing a general teaching applicable to any capacitor comprising a dielectric which has not been subjected to a thermal processing, the plasma processing step according to the invention overcoming the absence of such a thermal processing. It is thus conceivable, with the invention, to perform capacitors with polysilicon electrodes and to suppress the conventional thermal processing step, which is costly in terms of equipment and duration of the manufacturing process.

Conversely, when an annealing step can be applied to a dielectric layer (for example in the case of a capacitor with polysilicon electrodes), it is conceivable according to the invention to combine a plasma processing step according to the invention and a thermal processing step with a moderate temperature, in order to limit the diffusion of impurities (this problem being essential in sub-micron technologies) while "curing" the dielectric of impurities and pendant linkages, for reducing the leakage currents and the voltage non-linearity, and for increasing the reliability of the dielectric.

As well as capacitors with metallic electrodes, the method of the invention is thus applicable to capacitors of MOS transistors, to DRAM, EEPROM capacitors and to analog capacitors with polysilicon electrodes.

After various studies, the authors of the present invention have emitted the hypothesis that the above-mentioned non-linearity phenomenon, which appears a little only in capacitors with polysilicon electrodes, is linked to the fact that capacitors with metallic electrodes, unlike capacitors with polysilicon electrodes, are not subject to an annealing step at a high temperature, conventionally performed with a temperature in the order of 850° C. during several tens of minutes. It is indeed recalled that, in the conventional manufacturing process of integrated circuits, the conventional annealing steps for dopant activation are always performed before depositing the metallic layers, in order not to deteriorate them.

More particularly, the present invention is based on the hypothesis that the poor voltage linearity of capacitors with metallic electrodes is linked to the presence of impurities in the dielectric and/or to an incomplete formation of the dielectric (existence of pendant linkages), which are likely to disappear with a high temperature annealing.

It is important to note that while the present invention has been described in the context of a fully functional data processing system and/or network, those skilled in the art will appreciate that the mechanism of the present invention is capable of being distributed in the form of a computer usable medium of instructions in a variety of forms, and that the present invention applies equally regardless of the particular type of signal bearing medium used to actually carry out the distribution. Examples of computer usable mediums include: nonvolatile, hard-coded type mediums such as read only memories (ROMs) or erasable, electrically programmable read only memories (EEPROMs), recordable type mediums such as floppy disks, hard disk drives and CD-ROMs, and transmission type mediums such as digital and analog communication links.

While the invention has been particularly shown and described with reference to a preferred embodiment, it will be understood by those skilled in the art that various changes in form and detail may be made therein without departing from the spirit and scope of the invention.

What is claimed is:

1. Method of improving the voltage linearity of a capacitor with metallic electrodes integrated onto a silicon substrate, implemented in a method of manufacturing said capacitor comprising a step of depositing a metallic layer of a first electrode, a step of depositing a layer of dielectric material, and a step of depositing a metallic layer of second electrode, characterized in the, before the step of depositing the layer of second electrode, a step of exposure of the dielectric layer to a plasma is performed in the presence of ultraviolet light and under vacuum with conditions of duration, energy and density of plasma chosen to so that the dielectric layer is not damaged.

2. Method according to claim 1, wherein the plasma comprises an ultraviolet radiation with an intensity chosen among the high values of the ultraviolet intensity range provided by the plasma generator which is used.

3. Method according to claim 1, wherein the plasma is an argon/oxygen (Ar/$O_2$) plasma.

4. Method according to claim 1, wherein the plasma is an oxygen plasma.

5. Method according to claim 1, wherein the plasma is a nitrogen monoxide ($N_2O$) plasma.

6. Method according to claim 1, wherein the dielectric layer is deposited under gaseous phase at a temperature less than 500° C.

7. Method according to claim 1, wherein the dielectric layer is mainly made of silicon dioxide.

8. Method according to claim 1, wherein the dielectric layer is mainly made of of a material chosen in the group comprising silicon nitride (SiN), silicon oxinitride (SiON), and tantalum penoxide ($TA_2O_5$).

9. Method according to claim 1, wherein the metallic layer of the upper and/or lower electrode is made of a material chosen in the group comprising aluminum (Al), copper (Cu), tungsten (W), titanium (Ti), titanium nitride (TiN) and their alloys.

* * * * *